(12) United States Patent
Fulga et al.

(10) Patent No.: US 7,196,737 B1
(45) Date of Patent: Mar. 27, 2007

(54) METHOD OF USING CONTROL LOOPS IN A BROADBAND CABLE TUNER

(75) Inventors: Stefan Fulga, Great Dunmow (GB); David Rahn, Kanata (CA); Michael Toner, Nepean (CA); John Rogers, Ottawa (CA); Brian Robar, Bishops Stortford (GB); Zhan Feng Zhou, Bishops Stortford (GB)

(73) Assignee: SiGe Semiconductor Inc., Ontario (CA)

( * ) Notice: Subject to any disclaimer, the term of this patent is extended or adjusted under 35 U.S.C. 154(b) by 723 days.

(21) Appl. No.: 10/349,941

(22) Filed: Jan. 24, 2003

Related U.S. Application Data

(60) Provisional application No. 60/351,011, filed on Jan. 25, 2002.

(51) Int. Cl.
*H04N 5/63* (2006.01)

(52) U.S. Cl. .................. 348/730; 348/731; 455/343.1; 340/7.34

(58) Field of Classification Search ................ 348/730, 348/731, 725, 553; 725/14, 151, 152, 131, 725/132, 139, 140; 455/343.1; 713/320, 713/324, 323; 334/5, 11
See application file for complete search history.

(56) References Cited

U.S. PATENT DOCUMENTS

| | | | | |
|---|---|---|---|---|
| 4,188,568 A | * | 2/1980 | Manners ..................... | 315/411 |
| 4,518,961 A | * | 5/1985 | Davis et al. ................ | 340/7.35 |
| 4,549,217 A | * | 10/1985 | Sendelweck ................ | 348/380 |
| 5,027,428 A | * | 6/1991 | Ishiguro et al. ............ | 340/7.35 |
| 5,193,212 A | * | 3/1993 | Son ........................... | 340/7.36 |
| 5,373,557 A | * | 12/1994 | Diehl et al. ................ | 380/242 |
| 5,410,734 A | * | 4/1995 | Choi et al. ................ | 340/7.34 |
| 5,623,533 A | * | 4/1997 | Kikuchi et al. ............ | 455/572 |
| 5,701,599 A | * | 12/1997 | Aihara ..................... | 455/186.1 |
| 5,969,634 A | * | 10/1999 | Takashima et al. ........ | 340/7.34 |
| 6,177,964 B1 | | 1/2001 | Birleson et al. | |
| 6,271,893 B1 | * | 8/2001 | Kawaguchi et al. ........ | 348/725 |
| 6,285,406 B1 | * | 9/2001 | Brusky ...................... | 348/552 |
| 6,314,523 B1 | * | 11/2001 | Voltz ......................... | 713/324 |
| 6,452,645 B1 | * | 9/2002 | Kuhn et al. ................ | 348/731 |
| 6,462,327 B1 | * | 10/2002 | Ezell et al. ............. | 250/214 A |
| 6,472,957 B1 | | 10/2002 | Dobrovolny | |
| 6,515,716 B1 | * | 2/2003 | Suzuki et al. ............... | 348/730 |
| 6,593,975 B1 | * | 7/2003 | Oh ............................. | 348/730 |
| 6,650,376 B1 | * | 11/2003 | Obitsu ....................... | 348/730 |
| 6,704,063 B1 | * | 3/2004 | Van Der Wulp ............ | 348/734 |
| 6,731,346 B1 | * | 5/2004 | Nonomura et al. ......... | 348/554 |
| 6,759,904 B2 | * | 7/2004 | Behzad ...................... | 330/254 |
| 6,771,124 B1 | * | 8/2004 | Ezell ......................... | 330/129 |
| 6,900,849 B1 | * | 5/2005 | Friedreich .................. | 348/730 |
| 2002/0118065 A1 | * | 8/2002 | Miyamoto .................. | 330/254 |

* cited by examiner

*Primary Examiner*—Victor R. Kostak
(74) *Attorney, Agent, or Firm*—Kenyon & Kenyon LLP

(57) ABSTRACT

Currently tuner circuits maintain normal power consumption while they are receiving RF signals and do not have provisions therein for disabling portions of their circuitry for reducing of power consumption. For example, during changing of channels, portions of the tuner are not used while the tuner is waiting for channel data. Thus, disabling portions of the circuit while the tuner is waiting for data serves to reduce power consumption of the tuner. Furthermore, tuner power consumption is reduced by determining whether a signal input to the tuner circuit requires amplification or not, or whether linearity in the amplifier can be sacrificed by a reduction in amplifier gain. Thus, a tuner circuit is provided that has control loop circuitry to execute control loops for controlling the gain and linearity of the tuner, as well as power consumption of circuitry therein.

21 Claims, 5 Drawing Sheets

METHOD OF USING CONTROL LOOPS IN A BROADBAND CABLE TUNER

This application claims the benefit of U.S. Provisional Application No. 60/351,011 filed Jan. 25, 2002.

FIELD OF THE INVENTION

The invention relates to the area of cable tuner circuits and more specifically to the area of control loops used within cable tuner circuits to control internal functions thereof.

BACKGROUND OF THE INVENTION

Cable tuner circuits are used to receive a television signal from a television signal provider and to tune into a single channel within the television signal in order to present audio and video information from that channel to an end user. Cable tuners that operate using a superheterodyne circuit for use in a superheterodyne method of processing television signal information are commonplace. A superheterodyne receiver converts a desired signal to an intermediate frequency (IF) for filtering using a fixed bandpass filter. Signals having been passed through the fixed bandpass filter are processed by a second primary component of the receiver. A fixed bandpass filter is preferred because the filter characteristics are more readily and precisely determinable and hence the desired signal is more readily distinguishable from noise and other unwanted signals. Surface acoustic wave (SAW) filters are exemplary of the state of the art fixed bandpass filters used in television tuners.

Another aspect of tuner design relates to power consumption and bandwidth of operation. It is well understood in electronic circuit design that there is a typical tradeoff between speed and power consumption. Faster circuits consume more power and slower circuits consume less. Consequently, as the bandwidth for TV signals increases, the power consumption of the tuners increases. This increases heat dissipation and is therefore undesirable.

Furthermore, when tuners are active in a television, they are constantly consuming electrical power. This constant power consumption results in heating of the tuner circuit, which causes stress on the circuit components used to provide tuner functionality. A need therefore exists to enable and disable portions of the tuner circuit when they are not being utilized in order to reduce the power consumption of the tuner circuit.

It is therefore an object of the invention to provide a tuner circuit that implements executing of control loops in order to facilitate enabling and disabling circuit portions thereof to provide reduced power consumption.

SUMMARY OF THE INVENTION

In accordance with the invention there is provided a method of controlling power consumption of a tuner circuit comprising the steps of: providing an RF signal including information modulated therein to a tuner signal conditioning circuit for conditioning the RF signal; determining from the received RF signal an approximate linearity requirement and an approximate gain requirement; and, performing one of: increasing the gain of the tuner signal conditioning circuits and decreasing the linearity of the tuner signal conditioning circuits; and, decreasing the gain of the tuner signal conditioning circuits and increasing the linearity of the tuner signal conditioning circuits.

In accordance with the invention there is provided a method of performing power management in a cable tuner circuit comprising the steps of: determining a mode of operation for the cable tuner circuit in dependence upon predetermined parameters and an external input; and, disabling portions of the cable tuner circuit in dependence upon the determined mode of operation.

In accordance with the invention there is provided a tuner for receiving information signals within a channel selected from within a plurality of channels and being within a predesignated frequency band, the tuner comprising: a first filter for providing a passband, said passband being characterized by a bandwidth being sufficiently broad to admit signals in at least one of the plurality of channels with lesser attenuation than other signals; an input port for receiving information signals and conducting the received information signals to the filter; an output port for conducting any signals having been admitted by the first filter; superheterodyne circuitry including tuner signal conditioning circuits for processing any signals coupled thereto via the output port and discriminating the received information signals within the selected channel; and, a control loop circuit for performing at least one of controlling power provision to different circuit portions of the tuner superheterodyne circuitry and controlling gain and linearity of the tuner signal conditioning circuits, the control loop circuit other than a power switch for enabling and disabling of power provided to the entire tuner.

BRIEF DESCRIPTION OF THE DRAWINGS

Exemplary embodiments of the present invention will be described in conjunction with the following drawings, in which.

DETAILED DESCRIPTION OF THE INVENTION

Figure 1:
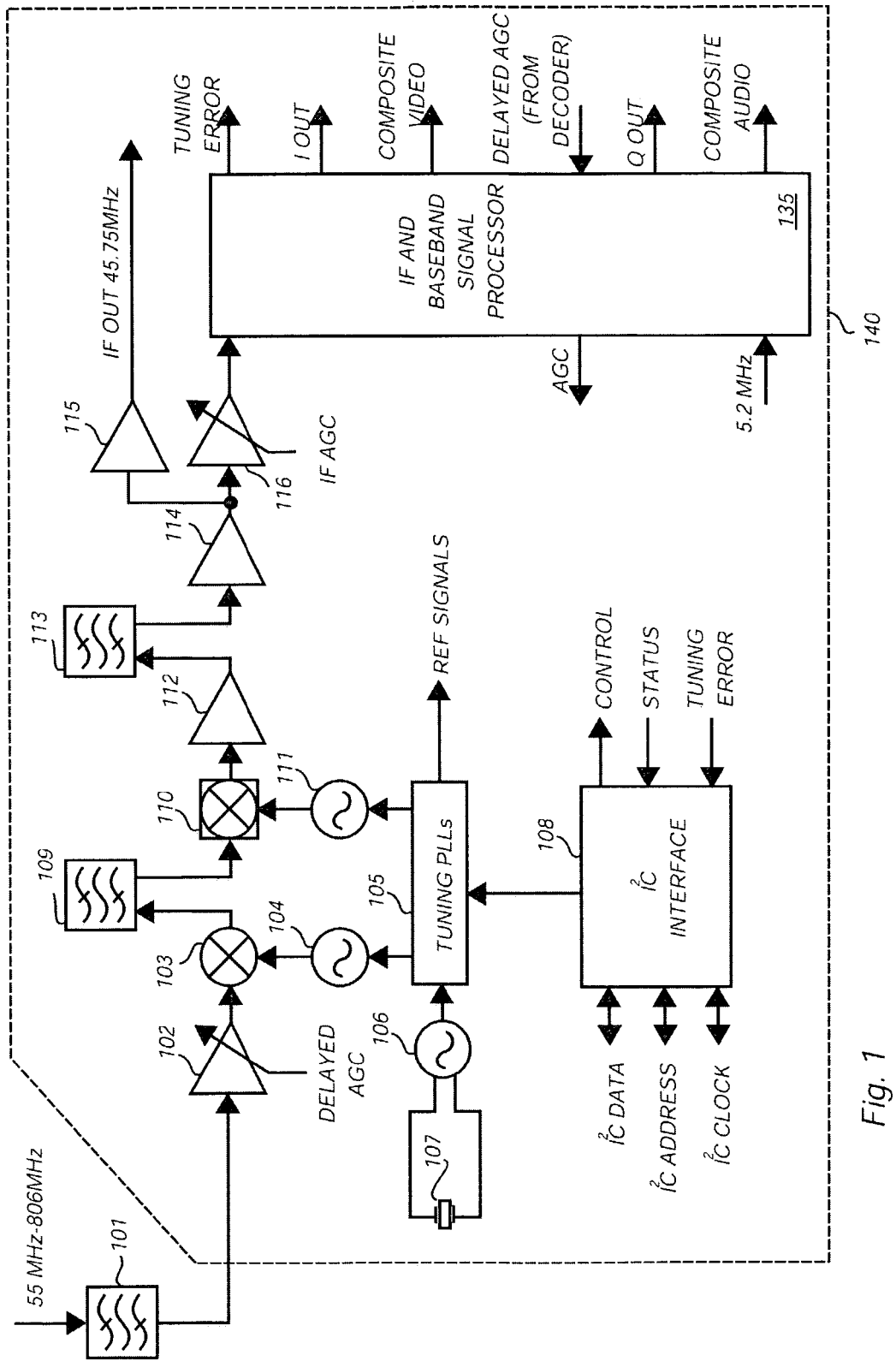
FIG. 1 illustrates a block schematic diagram of a prior art television tuner in accordance with that referenced as prior art in the U.S. Pat. No. 6,177,964.

The prior art television (TV) tuner illustrated in FIG. 1 is shown as being state-of-the-art in a discussion of prior art U.S. Pat. No. 6,177,964, entitled "Broadband Integrated Television Tuner".

Birleson et al. teach a broadband television tuner, as is shown in the block diagram of FIG. 1. RF signals in a range of 55 Mhz to 806 Mhz are received in the tuner through an input filter 101. The input filter 101 operates to attenuate signals above an input cut-off frequency corresponding to the highest frequency expected in the television band. As distinguished from the prior art TV tuner shown in FIG. 1, the input filter 101 is not tuned to select a few channels but instead passes all channels in the television band.

Radio frequency RF signals passing through the input filter 101, are passed to superheterodyne circuitry 140 including the on following components, where the RF signal passed through the input filter 101 are amplified by an amplifier 102. The amplifier 102 operates with a gain as determined by a delayed AGC signal. The amplifier 102 is provided by: either a variable attenuator coupled in series with a fixed gain amplifier, or a variable gain amplifier. In any event, this requires that the amplifier 102 be a low noise amplifier (LNA) having a high linearity with respect to the entire television band of frequencies and one that offers a wide dynamic range with respect to received RF signal amplitudes. Preferably the amplifier 102 has a transmission band that is sufficient to pass the entire television band. The amplifier 102 functions to control high input signal levels in the received RF signal since the tuner is capable of receiving signals from a variety of sources, such as an antenna or a cable television line. Typically, one or several antenna channel signals are strong in power, while the remainders are much weaker. This requires that the amplifier 102 have a very broad dynamic range in order that both the weaker signals and the stronger signals be received satisfactorily. In contrast, cable television signals may have signal strengths of +15 dBmV and may comprise 100 cable channels. The amplifier 102 must regulate in accordance with the varying signal levels in this broadband of received channels.

A mixer 103 receives input signals from the AGC amplifier 102 and a local oscillator 104. A first IF signal is generated in the mixer 103 and is provided to a first IF filter 109. The first IF filter 109 is a bandpass filter that provides coarse channel selection. As a matter of design choice, the first IF filter 109 may be constructed on the same integrated circuit substrate as mixers 103 and 101 or the first IF filter 109 may be a discrete off-chip device such as a radio frequency SAW filter. The first IF filter 109 is constructed to select a narrow band of channels, or perhaps only a single channel, from the television signals in the first IF signal.

A mixer 110 mixes the first IF signal from the first IF filter 109, with a second local oscillator signal from a local oscillator 111 to generate a second IF signal. The mixer 110 may be an image rejection mixer, if necessary, to reject unwanted image signals. The characteristics of the first IF filter 109, determines whether or not the mixer 110 must function to provide image rejection. If image frequencies of any desired channel are adequately attenuated by the first IF filter 109, then the mixer 110 may be a standard mixer.

Tuning phase locked loop (PLL) circuits 105 control local oscillators 104 and 111. Local oscillator frequencies are selected under the control of an Inter Integrated Circuit (IIC or I2C) bus interface 108, so that the picture carrier of a particular channel in the RF television signal spectrum appears at 43.75 MHz in the second IF signal. Of course, some other frequencies may be provided depending on the standards in a particular region or country where the TV tuner is intended for use. The tuning PLL circuits 105 receive reference signals from a reference oscillator 106, which is driven by a 5.25 MHz crystal 107. The I2C interface 108 provides control signals to the tuner 10 and monitors the status of the tuner 10 and the tuning PLL circuits 105.

In operation, the front end of the TV tuner receives the entire television band through the filter 101 and the amplifier 102. The mixer 103 up-converts the RF input signal so that a selected channel in the RF signal appears at a first IF frequency that is selected to pass through the filter 109. The first IF frequency is then down-converted to a second IF frequency of 43.75 MHz by the mixer 110. The frequency of the first local oscillator signal varies depending upon the specific channel desired in the RF signal. The second local oscillator is also optionally tunable when the second IF frequency is selected to be other than the typical 43.75 MHz.

Following the mixer 110, an amplifier 116, under the control of the AGC signal, amplifies the second IF signal. Signals being passed by the filter 113 either remain on-chip for further processing or can be provided to an off-chip device, such as a decoder (not shown), through a buffer 115. The amplifier 102 and the amplifier 116 operate in conjunction to control the overall signal level preparatory to further processing by circuit elements 118, 120–133. These circuit elements are connected as shown to provide an IF and baseband signal processor 135.

It is suggested that the second IF filter 113 may be constructed on the same integrated circuit substrate as the other elements of tuner, or it may be a discrete off-chip device. The amplifiers 112 and 114 are used to provide proper impedances for the SAW filter 113 as well as to provide gain to maintain system noise performance. The amplifier 112 must provide a powerful signal at the relatively low impedance preferred for operation of the SAW filter. Heat generated by the power amplification and the SAW filter attenuation is significantly large as compared with other functions in the prior art TV tuner.

Figure 2A:
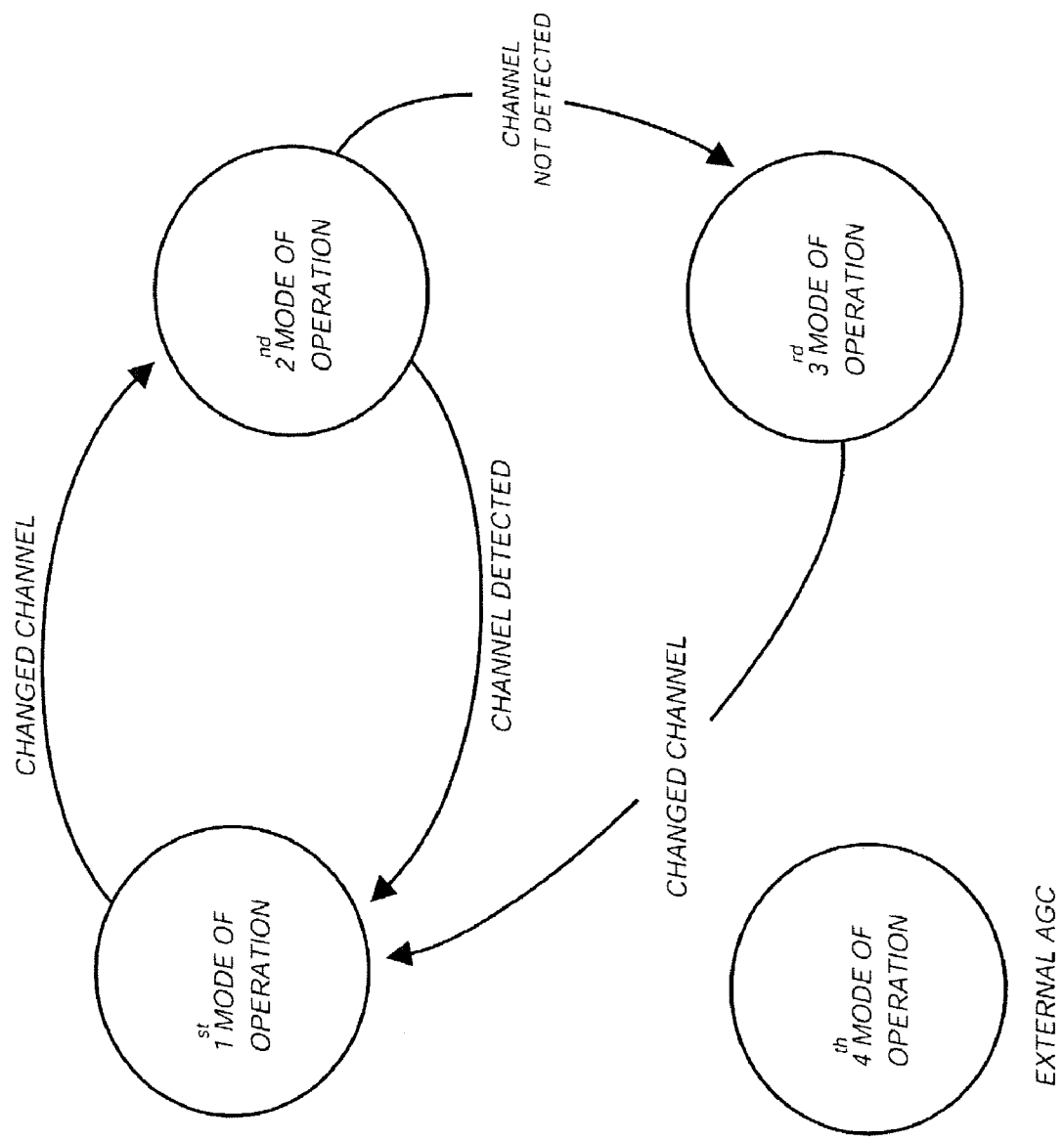
FIG. 2a illustrates steps used for enabling and disabling circuit blocks within the tuner in order to conserve electrical power, in dependence upon their power usage, in accordance with an embodiment of the invention.

In order to conserve electrical power within a tuner, for example the prior art tuner illustrated in FIG. 1, the tuner preferably has circuit blocks therein disabled in dependence upon their power usage, as is illustrated in the steps of FIG. 2a. Unfortunately, the present cable tuner standards do not support a power down mode of operation in a receiver. Though it would be beneficial to support lower power operation, it is not immediately evident how this is to be accomplished.

Figure 2B:
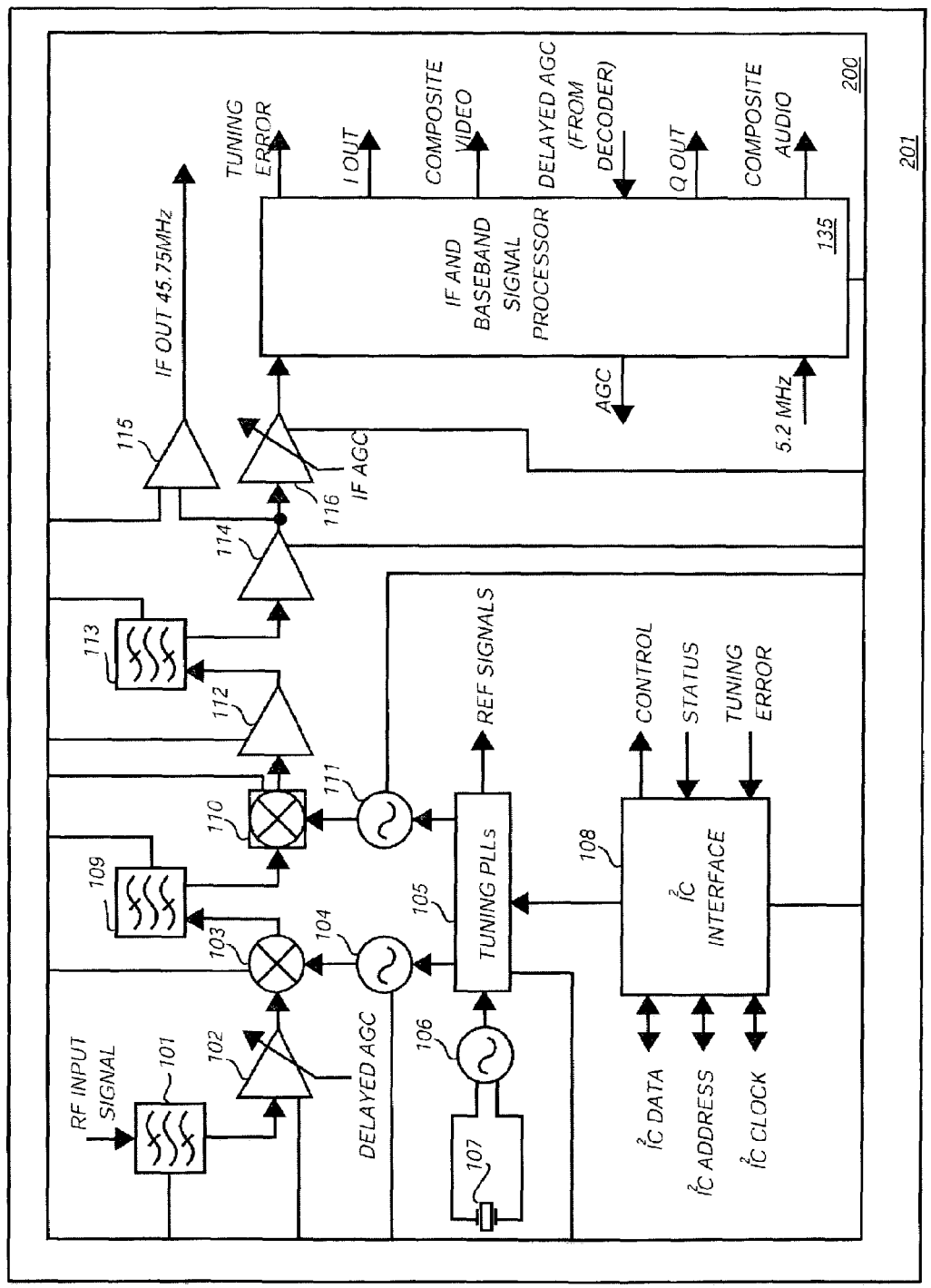
FIG. 2b illustrates a tuner in accordance with the invention, the tuner having a power management circuit used for enabling and disabling circuit blocks within the tuner.

In accordance with that shown in FIGS. 2a and 2b, preferably, the tuner 200 operates in four distinct power mode schemes, where a control loop circuit in the form of a power management circuit 201 controls these distinct power schemes. The power management circuit is connected to components within the tuner, including the superheterodyne circuitry including tuner signal conditioning circuits, for managing electrical power provided thereto. In a first mode of operation all circuit blocks for the tuner 200 are powered ON. In this first mode all RF blocks as well as the synthesizers are powered ON and are consuming normal electrical power in accordance with their circuit block requirements.

In a second mode of operation only the synthesizers and the I2C interface are ON. This mode is used when the IC2 has received an instruction to change a channel for viewing, but no signal has yet been received by the preamp from the filter.

Of course, if no data is to be received by from the filter, then the tuner 200 is placed into a third mode of operation, after some predetermined amount of time. If the device is subsequently placed in the second mode of operation, the tuner 200 reverts to the first mode for providing the previously programmed state.

In a third mode of operation only the I2C interface is ON. This is the lowest power consumption mode, while having the tuner 200 still powered ON. In this mode, the RF blocks as well as the synthesizer blocks are powered OFF. The I2C interface is left powered ON in order to allow tuner circuit blocks to be powered ON if activity takes place, such as changing of a channel by the user.

In a fourth mode of operation only the second IF is powered OFF. This mode allows the user to save power in an application where an external AGC amplifier is used. The power saving associated with this mode is approximately 20 mA. A low power tuner circuit typically draws 120 ma to 140 mA at 3.3 V; therefore 20 ma current reduction yields over a 14% increase in power savings. Advantageously, the method shown in FIG. 2a provides additional power savings during day-to-day operation of the tuner 200.

Figure 3A:
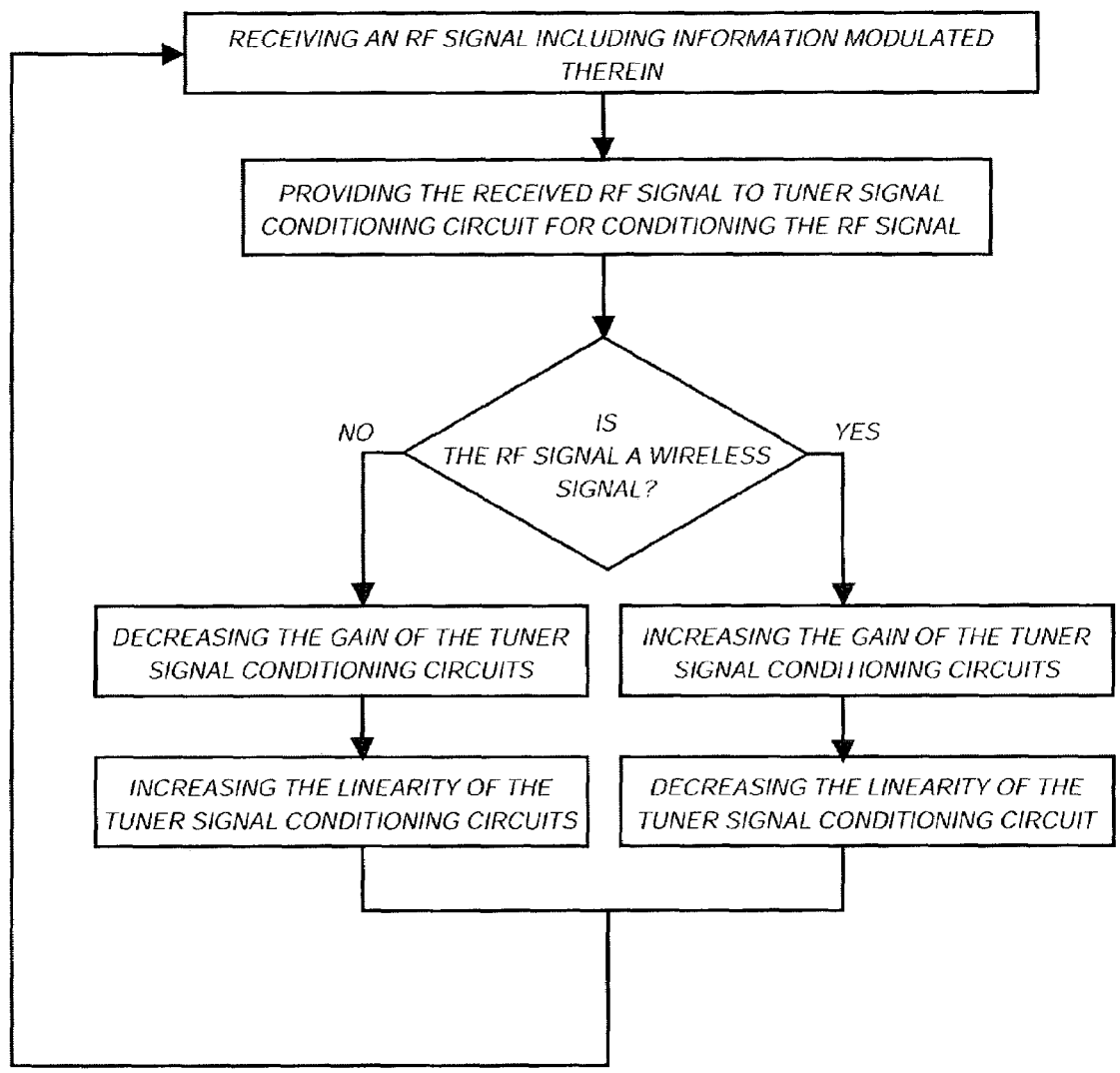
FIG. 3a illustrates an adaptive control loop used to change the linearity and gain of signals within the tuner in accordance with an embodiment of the invention; and, FIG. 3b illustrates a tuner in accordance with the invention, the tuner having circuitry for charging the linearity and gain of signals propagating therein.
Figure 3B:
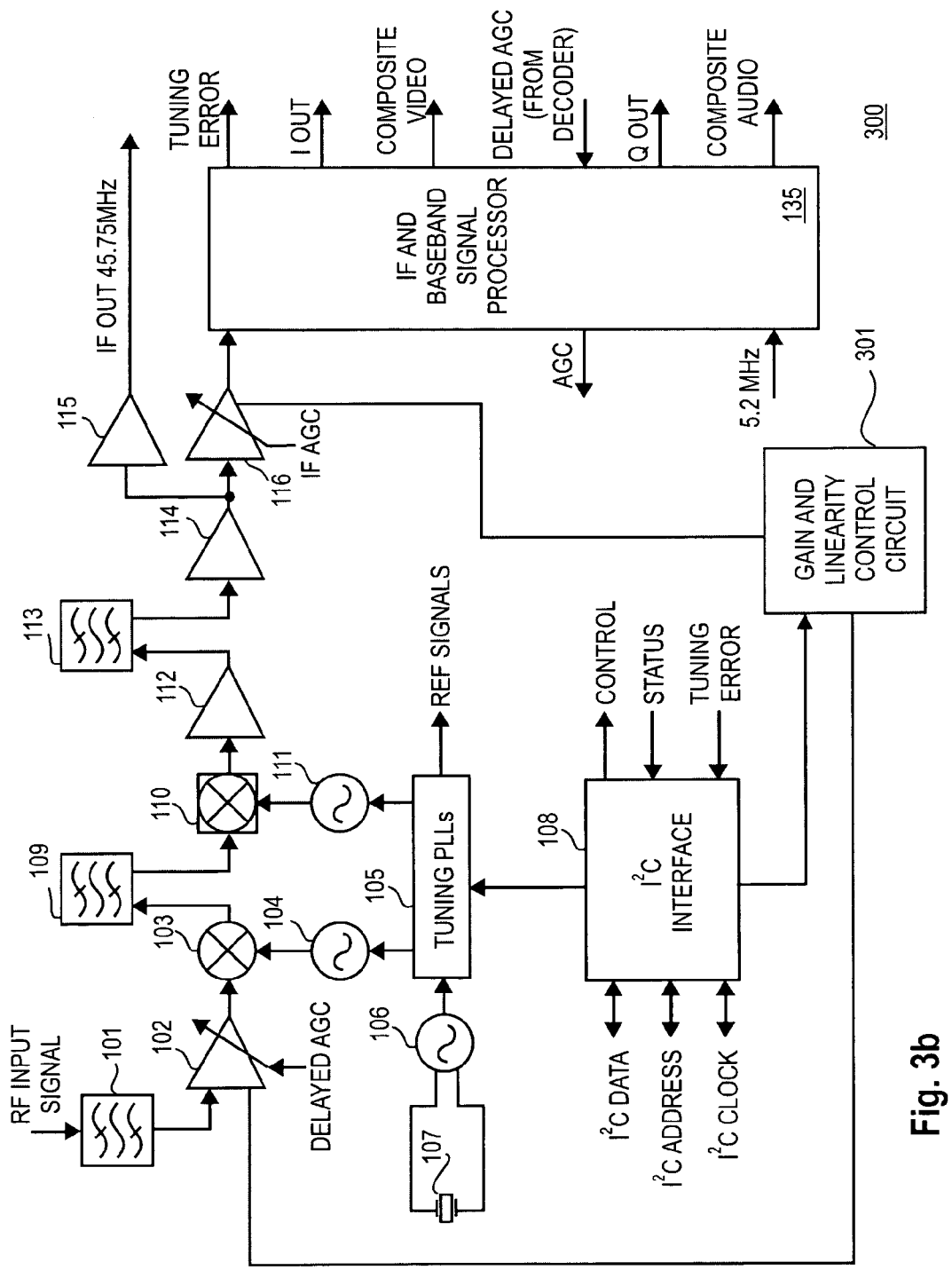

In order to be able to address mobile applications for the tuner, such as mobile TV, as well as stationary applications, such as coaxial cable, or in personal computer cards, an adaptive control loop is preferably integrated into a control loop circuit in the form of a gain and linearity control circuit 301 (FIG. 3b) within the tuner 300 (FIG. 3b). FIG. 3a illustrates such an adaptive control loop, where the adaptive control loop is used to change the linearity and gain of amplified signals within the tuner 300. Amplified signals within the tuner 300 propagate through the superheterodyne circuit including tuner signal conditioning circuits, where they are amplified using the delayed AGC 102 and the IF amplifier 116, to control the overall signal level in tuner 300. The gain and linearity of each of these amplifiers 102 and 116 is based on the AGC voltage supplied by the IF and baseband processor IC 135. To those of skill in the art it is known that more power provided to an amplifier circuit typically results in higher amplification linearity, and less power is typically required in order to obtain lower linearity. Furthermore, the higher the amplifier gain, the more power that is typically required for the amplifier, and of course, the less gain, the less power that is typically required by the amplifier. Thus, power consumption is reduceable in the amplifier circuits in dependence upon the linearity and the gain thereof.

If the tuner 300 is used for receiving a signal on a coaxial cable, then the RF input signal being provided to the tuner input port 300a is already of a high enough power that amplification is preferably not necessary. Thus, the AGC voltage supplied by the IF and baseband processor IC 135 is such that the gain of the delayed AGC amplifier 102 and IF AGC amplifier 116 is sacrificed, while maintaining high linearity for the signal propagating within the tuner 300.

However, if the tuner 300 is used for receiving RF input signals via a wireless medium, then the RF signal being provided to the tuner input port 300a is typically of a low power. Thus, the linearity of the amplified signal is sacrificed at the expense of amplification of the signal by the AGC amplifiers 102 and 116. By channeling operating power between gain and linearity for these amplifiers, power consumption is advantageously reduced in the tuner circuit 300. The difference in amplifier gain between operating for receiving RF signal via a wireless medium and receiving signals via a coaxial medium is approximately 10 dB, where the AGC gain is switched whenever the AGC voltage passes a preset threshold. Advantageously, the control loop allows selection of different thresholds depending on the application. Alternatively, the control loop is provided as a full software implementation through the digital I2C interface.

Advantageously, a tuner 200 and 300 operating using the control loops in accordance with the invention allows for full monitoring, through the I2C interface, of the control loops being executed therein The I2C interface provides the user at any time information about the frequency range picked by the control loop as well as information about the gain of the AGC amplifiers.

Optionally, the tuner allows for software programming of use of the various power modes of operation through the I2C interface.

Numerous other embodiments may be envisioned without departing from the spirit or scope of the invention.

What is claimed is:

1. A method of controlling power consumption of a tuner circuit comprising the steps of:
    providing an input port for receiving an RF signal including information modulated therein upon a plurality of channels and being within a predetermined frequency band;
    providing a tuner signal conditioning circuit for conditioning the RF signal comprising;
        a first filter for providing a passband; said passband being characterized by a bandwidth being sufficiently broad to admit signals in at least one of the plurality of channels with lesser attenuation than other signals;
        an output port for conducting any signals having been admitted by the first filter;
    superheterodyne circuitry including the tuner signal conditioning circuits for processing any signals coupled thereto via the output port and discriminating the received information signals within a selected channel;
    determining from the received RF signal an approximate linearity requirement and an approximate gain requirement; and,
    performing one of increasing the gain of the tuner signal conditioning circuits and decreasing the linearity of the tuner signal conditioning circuits and decreasing the gain of the tuner signal conditioning circuits and increasing the linearity of the tuner signal conditioning circuits; and,
    controlling power supplied to different circuit portions of the superheterodyne circuitry and tuner signal conditioning circuits, the power supplied being one of enabling and disabling of power provided.

2. A method according to claim 1 wherein the tuner signal conditioning circuit comprises a first amplifier circuit.

3. A method according to claim 2 wherein the first amplifier circuit is a low noise amplifier (LNA) circuit.

4. A method according to claim 1 wherein the tuner signal conditioning circuit comprises a first mixer circuit.

5. A method according to claim 4 wherein the first mixer circuit is an image reject mixer circuit.

6. A method according to claim 1 wherein the steps of increasing the gain of the tuner signal conditioning circuits and decreasing the linearity of the tuner signal conditioning circuits are performed for RF signals that are received using a wireless propagation medium.

7. A method according to claim 1 wherein the steps of decreasing the gain of the tuner signal conditioning circuits and increasing the linearity of the tuner signal conditioning circuits are performed for RF signals that are received using a direct cable connection propagation medium.

8. A method according to claim 1 further comprising performing power management in the tuner circuit comprising;
    determining a mode of operation for the tuner circuit in dependence upon predetermined parameters and one of a control loop and an external input; and,
    managing portions of the tuner circuit in dependence upon the determined mode of operation; wherein
    managing portions of the tuner circuit is by controlling power channeled to different portions of the tuner circuit, the power channeled being other than an enabling and disabling of power provided.

9. A method according to claim 8 wherein the managed portions are managed for periods of time that other than effect reception and decoding of RF signals received by the tuner.

10. A method according to claim 8 wherein the tuner allows for software programming of whether or not to perform the step of determining a mode of operation for the tuner circuit.

11. A method according to claim 10 wherein the software programming is provided to the tuner circuit using a programming input port disposed on an I2C interface.

12. A method according to claim 8 wherein the step of determining a mode of operation for the tuner is dependent upon input from a user.

13. A tuner for receiving information signals within a channel selected from within a plurality of channels and being within a predetermined frequency band, the tuner comprising:
   a first filter for providing a passband, said passband being characterized by a bandwidth being sufficiently broad to admit signals in at least one of the plurality of channels with lesser attenuation than other signals;
   an input port for receiving information signals and conducting the received information signals to the filter;
   an output port for conducting any signals having been admitted by the first filter;
   superheterodyne circuitry including tuner signal conditioning circuits for processing any signals coupled thereto via the output port and discriminating the received information signals within the selected channel; and,
   a control loop circuit for performing at least one of controlling power provision to different circuit portions of the tuner superheterodyne circuitry and controlling gain and linearity of the tuner signal conditioning circuits, the control loop circuit other than a power switch for enabling and disabling of power provided to the entire tuner.

14. A tuner according to claim 13 wherein the control loop circuit comprises:
   a power management circuit for varying the power consumption of portions of the superheterodyne circuitry.

15. A tuner according to claim 14 wherein the portions of the superheterodyne circuitry comprise at least a synthesizer.

16. A tuner according to claim 14 wherein the portions of the superheterodyne circuitry comprise radio frequency circuits.

17. A tuner according to claim 13 wherein the control loop circuit comprises:
   a gain and linearity control circuit for controlling the gain and the linearity of the tuner signal conditioning circuits.

18. A tuner according to claim 17 wherein the tuner signal conditioning circuits comprise at least an amplifier circuit.

19. A tuner according to claim 17 wherein the at least an amplifier circuit comprises a low noise amplifier circuit.

20. A tuner according to claim 13 wherein the control loop circuit comprising:
   a memory circuit, the memory circuit for storing instructions for executing the steps of:
      increasing the gain of the tuner signal conditioning circuits and decreasing the linearity of the tuner signal conditioning circuits; and,
      other than increasing the gain of the tuner signal conditioning circuits and increasing the linearity of the tuner signal conditioning circuits.

21. A tuner according to claim 13 wherein the control loop circuit comprising:
   an input port for receiving of user data; and,
   a memory circuit, the memory circuit for storing instructions for executing the steps of:
      determining a desired mode of operation for a tuner circuit in dependence upon predetermined parameters and an external input; and,
      disabling portions of the tuner circuit in dependence upon the determined mode of operation.

\* \* \* \* \*